(12) United States Patent
Woosnam (10) Patent No.: US 10,055,955 B2
(45) Date of Patent: Aug. 21, 2018

(54) NETWORKED COMMUNICATIONS AND EARLY WARNING SYSTEM

(71) Applicant: Technology Mining Company, LLC, Addison, TX (US)

(72) Inventor: Calvin H. Woosnam, Coquitlam (CA)

( * ) Notice: Subject to any disclaimer, the term of this patent is extended or adjusted under 35 U.S.C. 154(b) by 629 days.

(21) Appl. No.: 13/780,307

(22) Filed: Feb. 28, 2013

(65) Prior Publication Data

US 2013/0250848 A1    Sep. 26, 2013

Related U.S. Application Data

(63) Continuation of application No. 12/021,094, filed on Jan. 28, 2008, now abandoned.
(Continued)

(51) Int. Cl.
*G08B 13/196* (2006.01)
*H04H 20/02* (2008.01)
(Continued)

(52) U.S. Cl.
CPC ...... *G08B 13/19636* (2013.01); *F16F 15/121* (2013.01); *F16M 13/022* (2013.01); *G08B 13/1966* (2013.01); *H01B 7/17* (2013.01); *H01B 11/22* (2013.01); *H01Q 1/005* (2013.01); *H01Q 1/125* (2013.01); *H04B 1/38* (2013.01); *H04B 7/1851* (2013.01); *H04H 20/02* (2013.01); *H04H 20/61* (2013.01); *H04W 28/04* (2013.01); *H05K 7/1015* (2013.01); *H05K 7/2039* (2013.01); *H04H 20/59* (2013.01); *H04H 40/90* (2013.01)

(58) Field of Classification Search
CPC .............................. H04W 84/06; H04W 24/00

USPC ..................... 455/3.02, 404.1, 427–428, 521
See application file for complete search history.

(56) References Cited

U.S. PATENT DOCUMENTS

| 3,277,486 A | 10/1966 | Kuebler |
| 3,906,166 A | 9/1975 | Cooper et al. |

(Continued)

FOREIGN PATENT DOCUMENTS

| CN | 1339164 A | 3/2002 |
| EP | 0 566 328 A1 | 10/1993 |

(Continued)

OTHER PUBLICATIONS

Office Action dated Dec. 16, 2015, issued in corresponding JP Patent Application No. 2014-056116 (with English translation).
(Continued)

*Primary Examiner* — Dung Hong (57) ABSTRACT

A networked communications system comprising one or more integrated satellite based devices each for broadband digital signaling, one or more customized segment addressable cable assembly for terrestrial signaling in operable communication with the integrated satellite based device and a command console, the command console further comprising interconnectivity with public data or voice network signals through digital bridging; and a remote relay station in operable communication with the command console and the customized segment addressable cable assembly. Each detector includes a UWB receiver, processor and voice synthesis circuit, further embedded with a media access control address scheme for identity of each detector.

12 Claims, 10 Drawing Sheets

Related U.S. Application Data (60) Provisional application No. 60/886,905, filed on Jan. 26, 2007.

(51) Int. Cl.

| | | |
|---|---|---|
| *H04H 20/61* | (2008.01) | |
| *H04W 28/04* | (2009.01) | |
| *F16F 15/121* | (2006.01) | |
| *F16M 13/02* | (2006.01) | |
| *H01Q 1/00* | (2006.01) | |
| *H01Q 1/12* | (2006.01) | |
| *H01B 7/17* | (2006.01) | |
| *H01B 11/22* | (2006.01) | |
| *H04B 1/38* | (2015.01) | |
| *H04B 7/185* | (2006.01) | |
| *H05K 7/10* | (2006.01) | |
| *H05K 7/20* | (2006.01) | |
| *H04H 20/59* | (2008.01) | |
| *H04H 40/90* | (2008.01) | |

(56) References Cited

U.S. PATENT DOCUMENTS

| | | | |
|---|---|---|---|
| 4,110,554 A | 8/1978 | Moore et al. | |
| 4,172,257 A | 10/1979 | Mahner | |
| 4,374,378 A | 2/1983 | Lee | |
| 4,596,989 A | 6/1986 | Smith et al. | |
| 4,598,297 A | 7/1986 | Hawkins | |
| 4,685,649 A | 8/1987 | McKay | |
| 4,888,592 A | 12/1989 | Paik et al. | |
| 5,005,023 A | 4/1991 | Harris | |
| 5,195,158 A | 3/1993 | Bottoms, Jr. et al. | |
| 5,230,080 A | 7/1993 | Fabre et al. | |
| 5,303,393 A * | 4/1994 | Noreen | H04B 7/18523 |
| | | | 455/12.1 |
| 5,343,549 A | 8/1994 | Nave et al. | |
| 5,363,115 A | 11/1994 | Lipkin et al. | |
| 5,369,682 A | 11/1994 | Witsaman et al. | |
| 5,485,169 A | 1/1996 | Kitabatake et al. | |
| 5,615,520 A | 4/1997 | McGuire | |
| 5,777,583 A | 7/1998 | Canora et al. | |
| 5,793,813 A | 8/1998 | Cleave | |
| 5,832,379 A * | 11/1998 | Mallinckrodt | H04B 7/18558 |
| | | | 455/12.1 |
| 5,835,057 A | 11/1998 | van Heyningen | |
| 5,890,056 A | 3/1999 | Garner et al. | |
| 6,037,913 A * | 3/2000 | Johnson | H01Q 1/1207 |
| | | | 248/278.1 |
| 6,108,526 A | 8/2000 | van der Plas | |
| 6,169,476 B1 * | 1/2001 | Flanagan | G08B 21/10 |
| | | | 340/286.02 |
| 6,382,014 B1 | 5/2002 | Breton | |
| 6,400,927 B1 * | 6/2002 | Daniel | H04B 7/18513 |
| | | | 370/316 |
| 6,433,749 B1 | 8/2002 | Thompson | |
| 6,774,790 B1 | 8/2004 | Houston | |
| 6,791,205 B2 | 9/2004 | Woodbridge | |
| 6,980,725 B1 | 12/2005 | Swieconek | |
| 7,773,564 B2 | 8/2010 | Heath, Jr. et al. | |
| 7,983,835 B2 | 7/2011 | Lagassey | |
| 9,094,089 B2 | 7/2015 | Woosnam | |
| 2002/0160132 A1 | 10/2002 | Miersch | |
| 2002/0173270 A1 | 11/2002 | Buer | |
| 2002/0176712 A1 | 11/2002 | Brown | |
| 2002/0197030 A1 | 12/2002 | McAlpine et al. | |
| 2003/0021262 A1 | 1/2003 | Ma et al. | |
| 2003/0025791 A1 | 2/2003 | Kaylor et al. | |
| 2003/0026662 A1 | 2/2003 | Vidal et al. | |
| 2003/0048233 A1 | 3/2003 | Schotman et al. | |
| 2003/0080898 A1 | 5/2003 | Wang et al. | |
| 2003/0129995 A1 | 7/2003 | Niwa et al. | |
| 2003/0201907 A1 | 10/2003 | Thompson et al. | |
| 2004/0038675 A1 | 2/2004 | Criss et al. | |
| 2004/0114888 A1 * | 6/2004 | Rich | G02B 6/4469 |
| | | | 385/101 |
| 2004/0120665 A1 | 6/2004 | Hurley et al. | |
| 2005/0014499 A1 | 1/2005 | Knoblach et al. | |
| 2005/0034375 A1 | 2/2005 | Vanderbeken et al. | |
| 2005/0042999 A1 * | 2/2005 | Rappaport | H04B 1/719 |
| | | | 455/307 |
| 2005/0179539 A1 | 8/2005 | Hill et al. | |
| 2005/0248486 A1 * | 11/2005 | Lee | H01Q 3/02 |
| | | | 342/359 |
| 2005/0281517 A1 | 12/2005 | Wessels, Jr. et al. | |
| 2005/0288003 A1 | 12/2005 | Matsumura | |
| 2006/0017809 A1 | 1/2006 | Carroll | |
| 2006/0082263 A1 * | 4/2006 | Rimler | B60P 3/14 |
| | | | 312/201 |
| 2006/0095199 A1 | 5/2006 | Lagassey | |
| 2006/0150572 A1 | 7/2006 | Rawson-Harris | |
| 2006/0153094 A1 | 7/2006 | Majidi-Ahy et al. | |
| 2006/0222086 A1 | 10/2006 | Frye, Jr. | |
| 2006/0273894 A1 * | 12/2006 | Goehler | G08B 25/016 |
| | | | 340/539.13 |
| 2007/0019959 A1 | 1/2007 | Retnasothie et al. | |
| 2007/0052548 A1 | 3/2007 | Hankin et al. | |
| 2007/0100385 A1 | 5/2007 | Rawat et al. | |
| 2007/0110376 A1 | 5/2007 | Buthe et al. | |
| 2007/0201540 A1 | 8/2007 | Berkman | |
| 2008/0012788 A1 | 1/2008 | Brocheton et al. | |
| 2008/0028225 A1 | 1/2008 | Eckert et al. | |
| 2008/0164361 A1 | 7/2008 | Fancher | |
| 2008/0238671 A1 | 10/2008 | Woosnam | |
| 2009/0042513 A1 | 2/2009 | Woosnam | |
| 2009/0226177 A1 | 9/2009 | Woosnam | |
| 2010/0095769 A1 | 4/2010 | Matsumoto et al. | |
| 2010/0220191 A1 | 9/2010 | Throckmorton et al. | |
| 2011/0094302 A1 | 4/2011 | Schofield et al. | |
| 2011/0232384 A1 | 9/2011 | Akashi et al. | |
| 2013/0250848 A1 | 9/2013 | Woosnam | |
| 2014/0099822 A1 | 4/2014 | Duesterhoeft | |
| 2015/0288051 A1 | 10/2015 | Woosnam | |

FOREIGN PATENT DOCUMENTS

| | | |
|---|---|---|
| EP | 1 161 758 B1 | 12/2001 |
| GB | 2 242 035 A | 9/1991 |
| JP | 61-99111 U | 6/1986 |
| JP | 10068854 A | 3/1998 |
| JP | 2002-536504 A | 10/2002 |
| WO | 2010/041148 A1 | 4/2010 |

OTHER PUBLICATIONS

Notice of Allowance dated Sep. 10, 2015, issued in corresponding Mexican patent application No. MX/a/2011/003718.
U.S. Office Action, U.S. Appl. No. 12/021,066, dated Jan. 25, 2010.
U.S. Office Action, U.S. Appl. No. 12/021,066, dated Sep. 1, 2010.
U.S. Office Action, U.S. Appl. No. 12/021,066, dated May 25, 2011.
U.S. Office Action, U.S. Appl. No. 12/021,066, dated Dec. 27, 2011.
U.S. Office Action, U.S. Appl. No. 12/021,066, dated Nov. 28, 2012.
U.S. Office Action, U.S. Appl. No. 12/021,076, dated Mar. 14, 2012.
U.S. Office Action, U.S. Appl. No. 12/021,076, dated Jan. 4, 2013.
U.S. Office Action, U.S. Appl. No. 12/246,445, dated Mar. 13, 2012.
U.S. Office Action, U.S. Appl. No. 12/246,445, dated Jan. 16, 2013.
U.S. Office Action, U.S. Appl. No. 13/865,668, dated May 8, 2014.
U.S. Granted related U.S. Appl. No. 13/865,668 dated Jan. 6, 2015.
Notice of Allowance U.S. Appl. No. 13/865,668, dated Mar. 20, 2015.
U.S. Office Action, U.S. Appl. No. 13/935,232, dated Jul. 21, 2015.
U.S. Office Action, U.S. Appl. No. 13/780,307, dated Sep. 11, 2015.
Australian Patent Examination Report No. 1 Patent Application No. 2009302116, dated Mar. 20, 2014.
Israeli Notification of Defects, Patent Application No. 212168, Feb. 28, 2013.
Israeli Notification of Defects, Patent Application No. 212168, Sep. 7, 2014.
Japanese Notice of Reasons for Rejection, Patent Application No. 056116/14, dated Jun. 19, 2015.

(56) References Cited

OTHER PUBLICATIONS

Korean Notice of Allowance, 9-5-2015-025642157, dated Apr. 17, 2015.
New Zealand Intellectual Property Office, First Examination Report, IP No. 628023, dated Aug. 13, 2014.
International Search Report International Application No. PCT/IB2009/007304, dated Feb. 19, 2010.
Mexican Office Action, Patent Application No. MX/a/2011/003718, dated May 13, 2014.
Mexican Office Action, Patent Application No. MX/a/2011/003718, dated Feb. 3, 2015.
Chinese First Office Action, Patent Application No. 200980149029.3, dated Oct. 9, 2012.
Chinese Second Office Action, Patent Application No. 200980149029.3, dated Jul. 9, 2013.
Chinese Third Office Action, Patent Application No. 200980149029.3, dated Mar. 28, 2014.
Japanese Decision to Grant Patent, Patent Application No. 2011-530590, dated Feb. 19, 2014.
Japanese Notice of Reasons for Rejection, Patent Application No. 2011-530590, dated Apr. 19, 2013.
Office Action, U.S. Appl. No. 13/935,232, dated Oct. 7, 2015.
New Zealand Examination Report, Patent Application No. 592664, dated Sep. 10, 2012.
New Zealand Examination Report, Patent Application No. 592664, dated Feb. 25, 2014.
New Zealand Further Examination Report, Patent Application No. 592664, dated May 6, 2014.
New Zealand Notice of Acceptance, Patent Application No. 592664, dated Oct. 31, 2014.
South African Notice of Acceptance Patent Application No. 2011/03294 dated Aug. 8, 2012.

\* cited by examiner

SMA RF ANTENNA CONNECTOR 6.0
2.50
1.750
TRANSCEIVER MODULE

POWER AND DATA EDGE CONNECTOR

FIG. 6B

RF MODULE

P200 MODULE

DIGITAL MODULE

FIG. 6C

OMNI-DIRECTIONAL FRACTAL ANTENNA OPTION

FIG. 6D

UWB DIRECTIONAL PARABOLIC ANTENNA PROTOTYPE - USING FRACTAL EMITTER

FIG. 8

FLANGED 24"Hx36"Lx8"D WITH FLIP-DOWN HINGED LOCKING COVER TO HOLD UPS, UWB, SENSOR PANEL AND COMPUTER FOR COMMAND CONSOLE FUNCTION

NETWORKED COMMUNICATIONS AND EARLY WARNING SYSTEM

CROSS-REFERENCES TO RELATED APPLICATIONS

This application is a continuation of U.S. application Ser. No. 12/021,094, filed Jan. 28, 2008 which claims benefit of priority from U.S. Provisional Application No. 60/886,905, filed Jan. 26, 2007, both of which are incorporated by reference herein in their entirety.

BACKGROUND OF THE INVENTION

The inventions described relate generally to a communications system. More particularly, the inventions herein relate to a fault tolerant intra-communications and intercommunications systems and assemblies thereof.

Most, if not all, cable systems used in communications and power industries are designed to comply with a single function, that being either power or communications. And when it comes to different modes of power or communications components have been designed separately and independently; few if any may truly integrated with other components. Connectivity standards of such components are also not designed to withstand damage (e.g., fire or mechanical problems). As such, current systems are unreliable and do not function or remain operational under adverse or emergency conditions.

SUMMARY

The inventions described herein solve many problems associated with current communications systems.

Generally, and in one form, is provided is provided a fault tolerant networked communications system for narrow and broad band signal communication, the system operable with one or more transceivers, detectors and segment addressable communications (SACA) assemblies for terrestrial and wireless communication.

Those skilled in the art will further appreciate the above-noted features and advantages of the invention together with other important aspects thereof upon reading the detailed description that follows in conjunction with the drawings.

BRIEF DESCRIPTION OF THE DRAWINGS

For more complete understanding of the features and advantages of the present invention, reference is now made to the detailed description of the invention along with the accompanying figures, wherein.

DETAILED DESCRIPTION

Although making and using various embodiments of the present invention are discussed in detail below, it should be appreciated that the present invention provides many inventive concepts that may be embodied in a wide variety of contexts. The specific aspects and embodiments discussed herein are merely illustrative of ways to make and use the invention, and do not limit the scope of the invention.

In the description which follows like parts may be marked throughout the specification and drawing with the same reference numerals, respectively. The drawing figures are not necessarily to scale and certain features may be shown exaggerated in scale or in somewhat generalized or schematic form in the interest of clarity and conciseness.

This application is being filed concurrently with co-pending U.S. patent applications, each of which claims the benefit for priority from U.S. Provisional Application No. 60/886,905 filed Jan. 26, 2007, and each describing aspects of the invention described herein, including GIMBALED MOUNT SYSTEM FOR SATELLITES (U.S. patent application Ser. No. 12/020,269), NETWORKED COMMUNICATIONS SYSTEM AND SEGMENT ADDRESSABLE COMMUNICATIONS ASSEMBLY Box, CABLE AND CONTROLLER, AND SECURITY ASSEMBLY AND SYSTEM.

The communications system as described herein includes an integrated satellite based device capable of broadband digital signaling, the device is also referred to herein as satellite unit (SU). Each SU is able to be in constant alignment with a desired satellite. The satellite dish itself may be round or elliptical and mounted, generally in a vertical orientation, parallel to the horizontal plane. The mount may be a gimbaled mounting system, motorized, and/or self-aligning. Preferably, the satellite is self-powered and self-contained and comprises a dish assembly, a self-stabilizing mount, and a controller section containing a transceiver for wireless communication. A transceiver, as described herein, is operational at variable power levels and wavelengths and compliant with public local area network (LAN) use (e.g., IEEE/ITU 802.15.4) and emergency/military use (e.g., IEEE/ITU 802.15.3). An SU having a transceiver, typically a radio frequency transceiver, is coupled with ultra wide band (UWB) technology to re-broadcast information to other receivers.

Further included with a system described herein is a custom cable assembly also referred to as a segment addressable communications assembly (herein "SACA") cable system or a terrestrial link. In one form, a SACA cable system allows one or more SUs to become operable with a command console. A SACA cable system may offer both vertical and horizontal integration of information to a command console.

A command console may be located anywhere, preferably in a position considered safe, such as a building, shelter, emergency operation center, disaster coordination center, emergency dispatch center. In another preferred embodiment, the command console is positioned separate and apart from a safe location and while positioned independently is still in operational communication with such safe locations. In the latter design, a command console initiates communication with the safe location via a broadband connection through the SU satellite. A command console also has interconnectivity with any public data or voice network through digital bridging. Thus, a command console may also initiate communication with any public data or voice network via digital bridging.

Command console-initiated communication is provided through one or a number of sites, including a central monitor and/or one or more detectors. Control of the SU transceiver is also under the command of the central monitor via software. Thus, the SU provides a fault tolerant broadband satellite link that is also integrated with other components.

Figure 1:
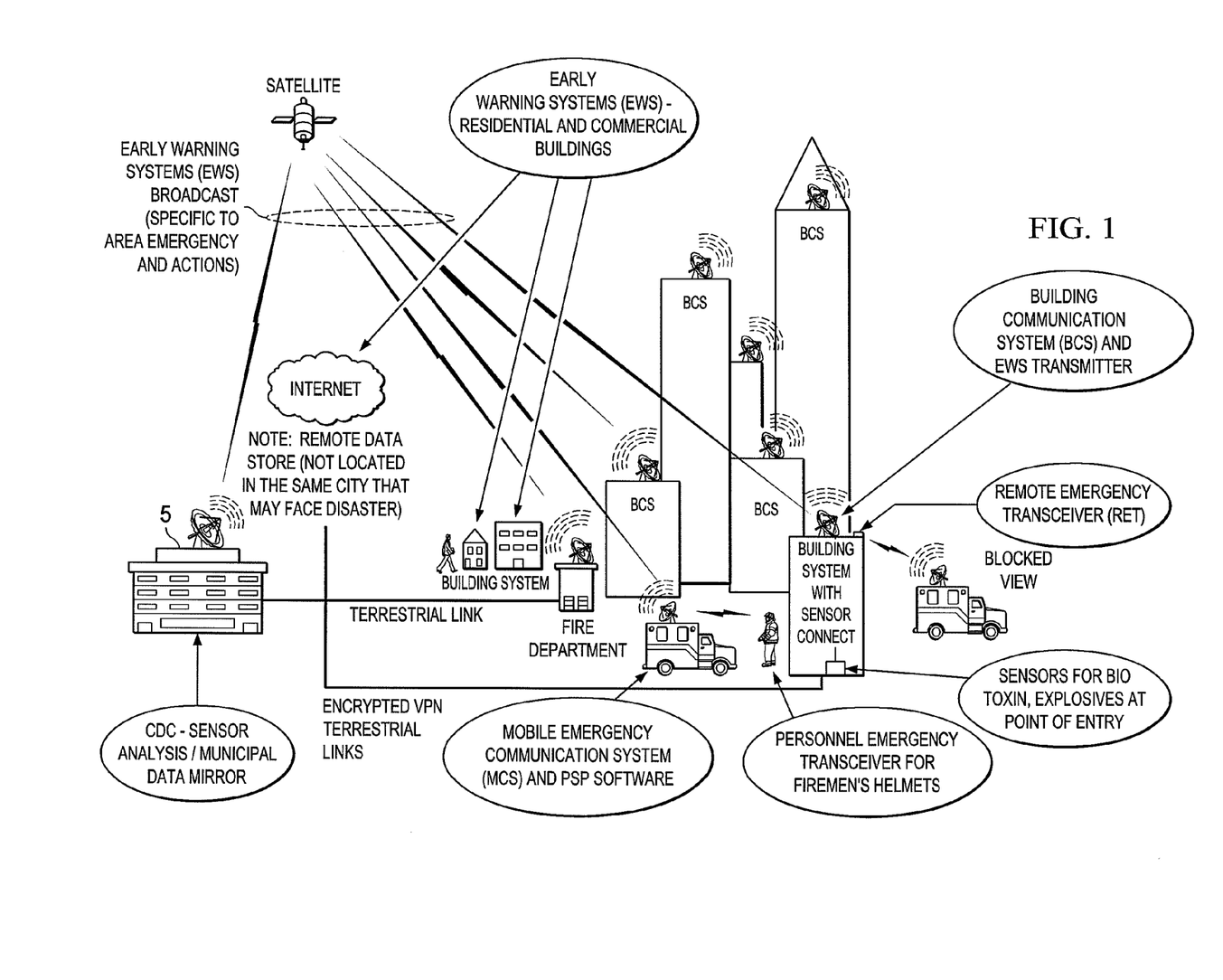
FIG. 1 depicts a representative flow chart of a communications system described herein.

Each command console offers interconnectivity via a network with one or more SUs. As such, a central monitor connects one or more SUs with one or more receiving units, which includes safe locations, homes, offices and other network locations. A central monitor may also be in operable communication with a detector. A schematic representation of a communications system described herein is illustrated in FIG. 1 and described further below.

Detectors include sensors (remote controlled or otherwise and include sensors for, e.g., radiation, chemical, bio-hazard, explosive, seismic, heat, pressure). One or more detectors may be associated with an SU.

The communications system described herein is further provided with an electrical power source. Each power source is interfaced at a command center using existing wiring and/or a remote data acquisition system. A power source provides a means for interconnectivity to sensors and/or for relaying other information, such as audible information in the form of alerts or sirens. A power source may be also be maintained at the central monitor.

As described herein, a communications system includes in part or in whole one or a number of SUs at one or a number of locations with command centers and a central monitor. The communications system may act as an alert, warning, control or monitoring system. Information communicated though the communications system may be relayed to one of a number of ports, including computer, landline telephone, cellular phone, PDA, lighting unit, and mechanical system (e.g., via a Web page-enabled manager), as examples.

A command console generally includes hardware, its own un-interruptible power supply (UPS) power supply, a routing box, and another transceiver. One or more UPS power each command console. A command console serves as a primary power source to an SU. Cabling between an SU and the command console is through a SACA cable assembly system, which includes an armored mechanically and thermally protected cable having sectionally addressable access points. In one form, a SACA cable assembly system may be used as a tunable antennae system depending on its location (e.g., within a building having diverse locations). A command console is, therefore, capable of interconnecting with a building and with a pre-wired system.

Additionally or as an alternative, further links may be installed in the command console using UWB technology (e.g., IEEE/ITU 802.15.4/UWB). Such added bridge components may be installed at a remote location within an equipped SU to relay signals to the command console. This prevents additional wiring and offers enhanced reliability to the system.

Figure 2A:
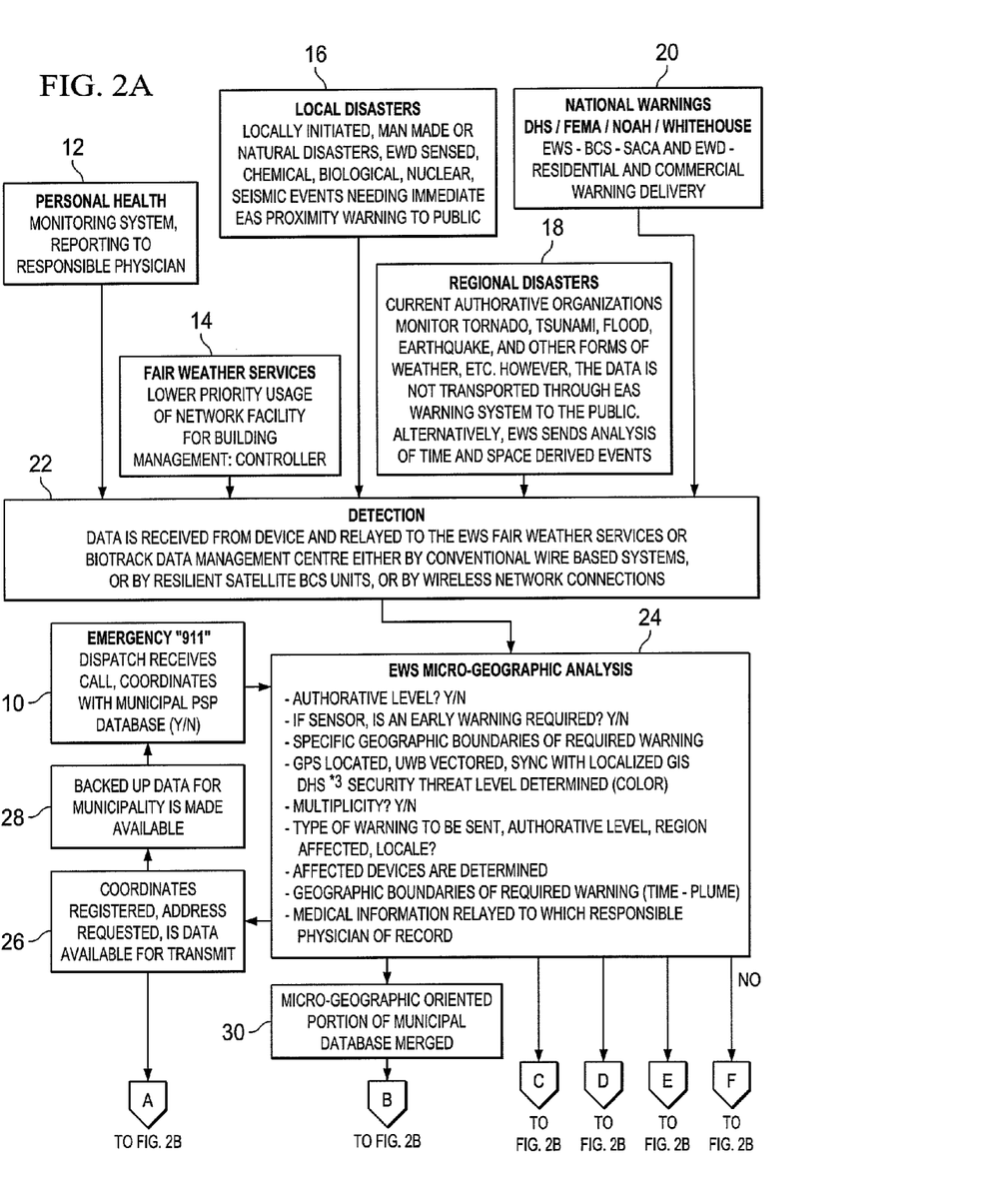
FIGS. 2A and 2B depict a representative fabricated cable assembly as described herein.
Figure 2B:
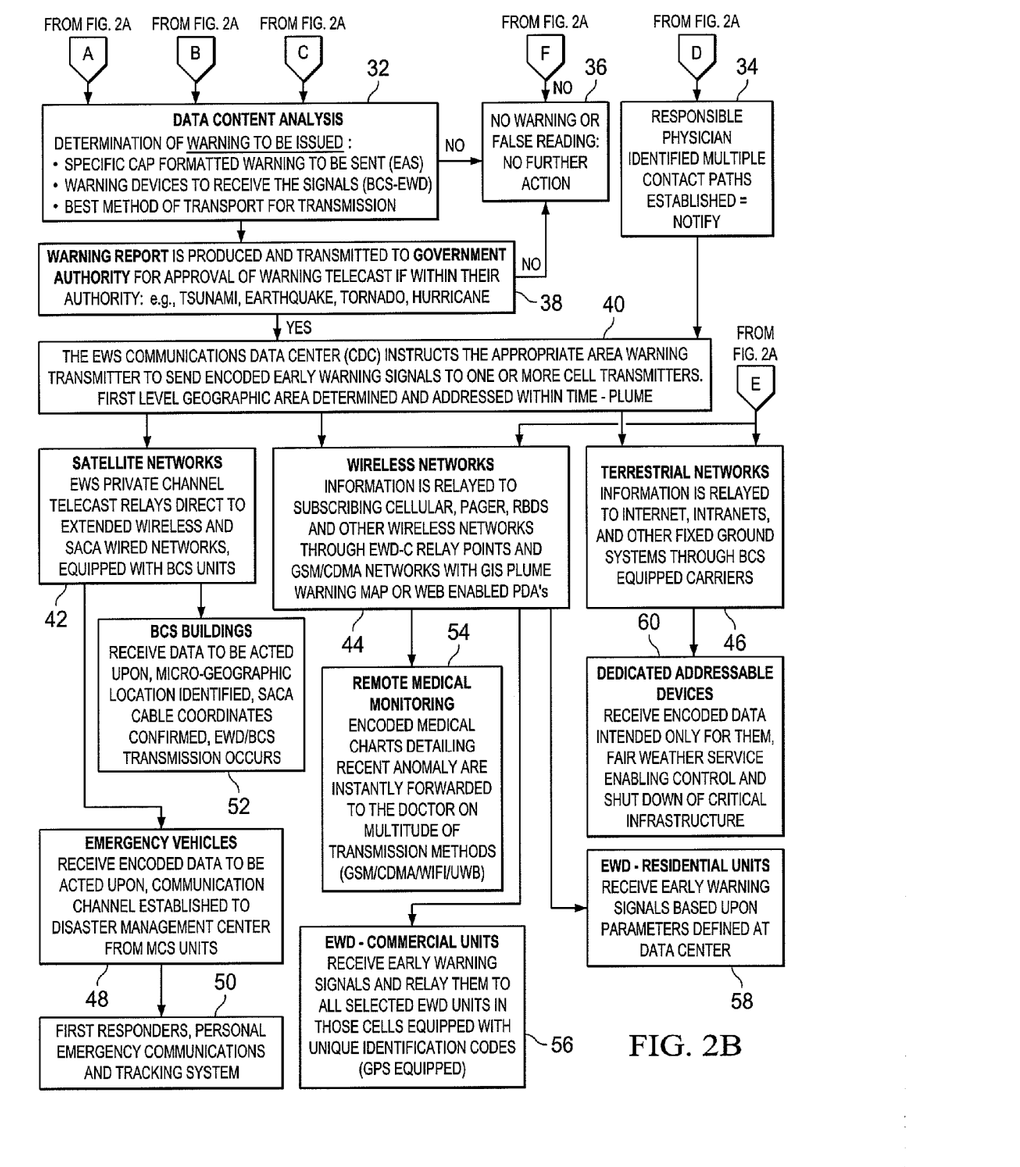
Figure 3:
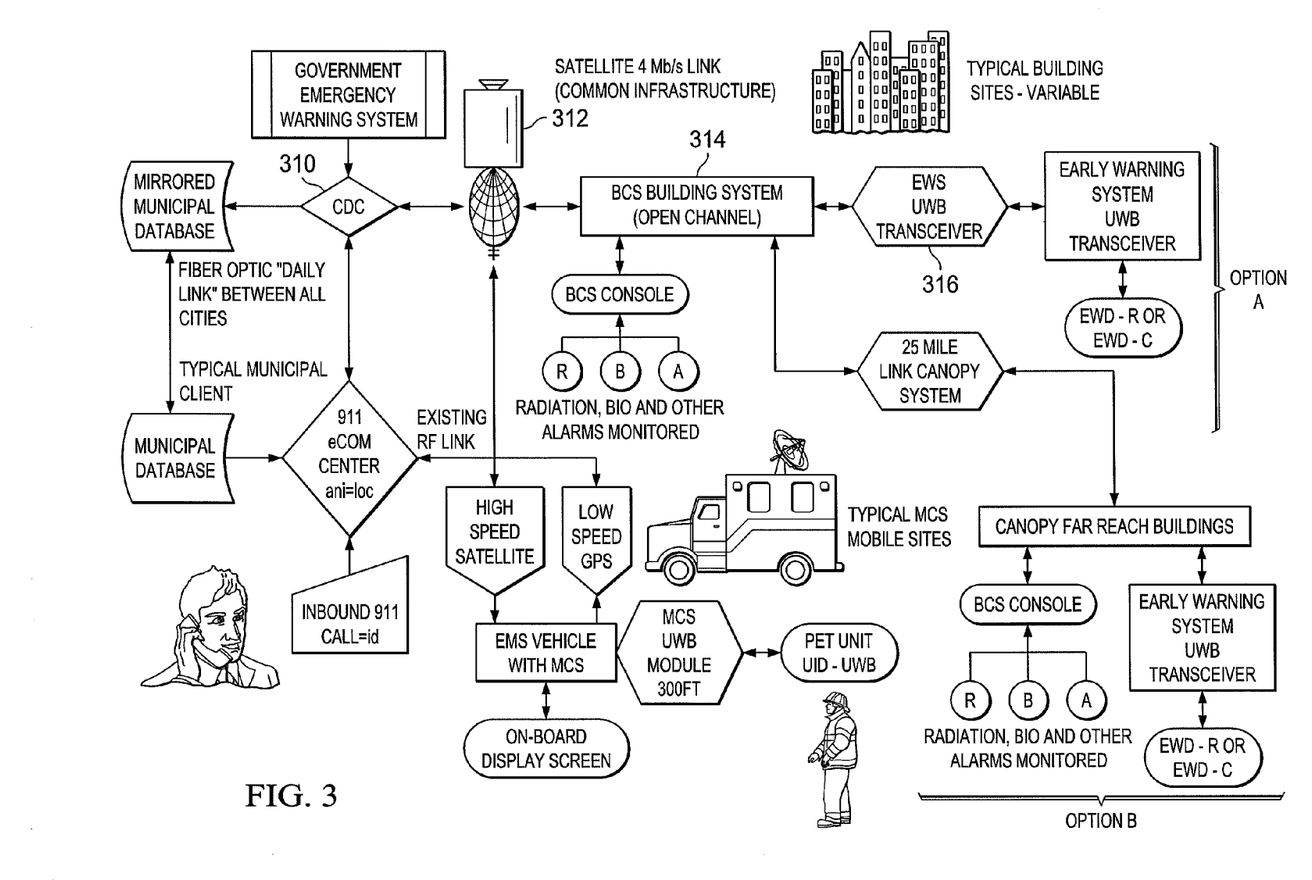
FIG. 3 depicts a systems flow chart for representative signal path routes as described herein.

In one communication relay pathway, a central monitor provides information to a command console located in a building that is received from a service provider (e.g., environmental, security, facilities management, utilities). The information is generally received wirelessly and via a direct connection to the equipped building. Generalized flow chart of some representative communications pathways as described herein are depicted in FIGS. 2 and 3. Services such as private network devices and Voice over Internet Protocol (VoIP) may be supplied wirelessly using the communications systems described herein. An equipped building may also act as a relay station by way of its transceiver to provide broadband re-direct-able connections to other sites equipped to receive the communication. This provides an abundant number of resources for communicating information.

For a building unit, referred to herein as BCS unit, each unit is comprised of a mounted and/or motorized satellite dish akin to an SU. In one preference, the satellite dish is mounted using a stainless steel gimbaled mount system, as disclosed further in co-pending U.S. patent application Ser. No. 12/020,269, that uses gravity to keep orientation vertical and the dish mount parallel to the horizontal plane and is able to adjust for changes in the mounting surface by being as much as 30 degrees off parallel from the earths surface. This preferred mounting system relies on blade bearing points to eliminate lubrication for positional sensitivity with minimal friction when there is minor movement and is designed to support and handle environmental elements as well as if not better than an elliptical 36" dish mounted to its suspension platform. This same mount system also incorporates a lower adjustable tension damping system to account for geographic natural wind loading. A winch mechanism may either increase or decrease stabilizing spring tension by lengthening or shortening the tension points.

The satellite dish of a BCS may be an elliptical KU Band (e.g., 24 inch by 36-inch) or a round (e.g., 26 inch diameter) KA Band satellite dish, as examples. Generally, any satellite dish with broadcasting capability is suitable with the communications system described herein. Each BCS unit is designed to remain operational even during severe conditions or with building damage because it is self powered and self-connected.

Like the SU, the BCS unit is comprised of at least three sections, including the dish assembly, a self-stabilizing mount, and water tight controller section (or controller system, herein "CS") containing a radio frequency transceiver disclosed further in co-pending U.S. patent application Ser. No. 12/021,076. The transceiver is an Ultra Wide Band (UWB) radio frequency device operating in both the International Telephone Union (ITU) standard, and the Federal Communications Commission standard at 802.15.3 and 802.15.4. The transceiver with its embedded UWB signal will broadcast a digital control signal that penetrates the walls of buildings. Under a special FCC exception to use of 802.15.3 devices, the transceiver is used as a horizontal hub transmitter distributing emergency broadcast signals from every roof top of every commercial building where BCS units are installed. The transceiver takes advantage of a chip that provides signal transmission at much higher power levels, therefore enhancing signal transmission through thicker walls or over longer distances.

The transceiver when used as a true 802.15.3 device will elevate RF power such that a signal may reach 3 miles while penetrating into residential homes and other buildings (commercial or residential). Thus, a BCS equipped with a transceiver, and drawing a 3 mile circle should enable 90% at least of all inhabitants and buildings within a municipality to be within UWB radio range with typically fewer than 100

BCS units. As an example, the greater Los Angeles area of California has 103 Fire Stations and would need less than 60 BCS units with transceivers to encircle the entire region and all fire stations.

The BCS unit is further connected via a custom SACA cable assembly system disclosed further in co-pending U.S. patent application Ser. No. 12/246,445. The SACA system connects the BCS to a command console located generally in the same building as the BCS unit, preferably in a safe location in the building.

From the BCS command console the operator may initiate a broadband connection via satellite with a Communications Data Center or CDC (box 40, FIG. 2). The CDC provides complete interconnection via its networks with all BCS units connecting them to their respective disaster coordination centers, emergency operation centers (EOC) or 911 Dispatch Centers (boxes 10-20, FIG. 2).

Figure 7:
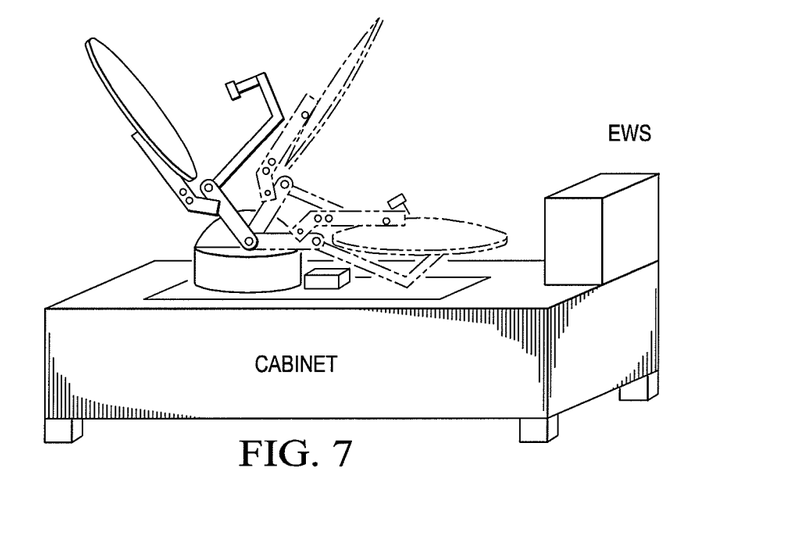
FIG. 7 depicts a representation of an optional powered satellite dish mount for heavy snow areas

The radio frequency transceiver of the CS is located at the same building as the BCS, generally on the roof, and, in conjunction with a system referred to herein as an Early Warning System (EWS), is controlled and under the command of the CDC, forming a re-broadcast point for EWS transmissions. An exemplary design is shown in FIG. 7.

Figure 4A:
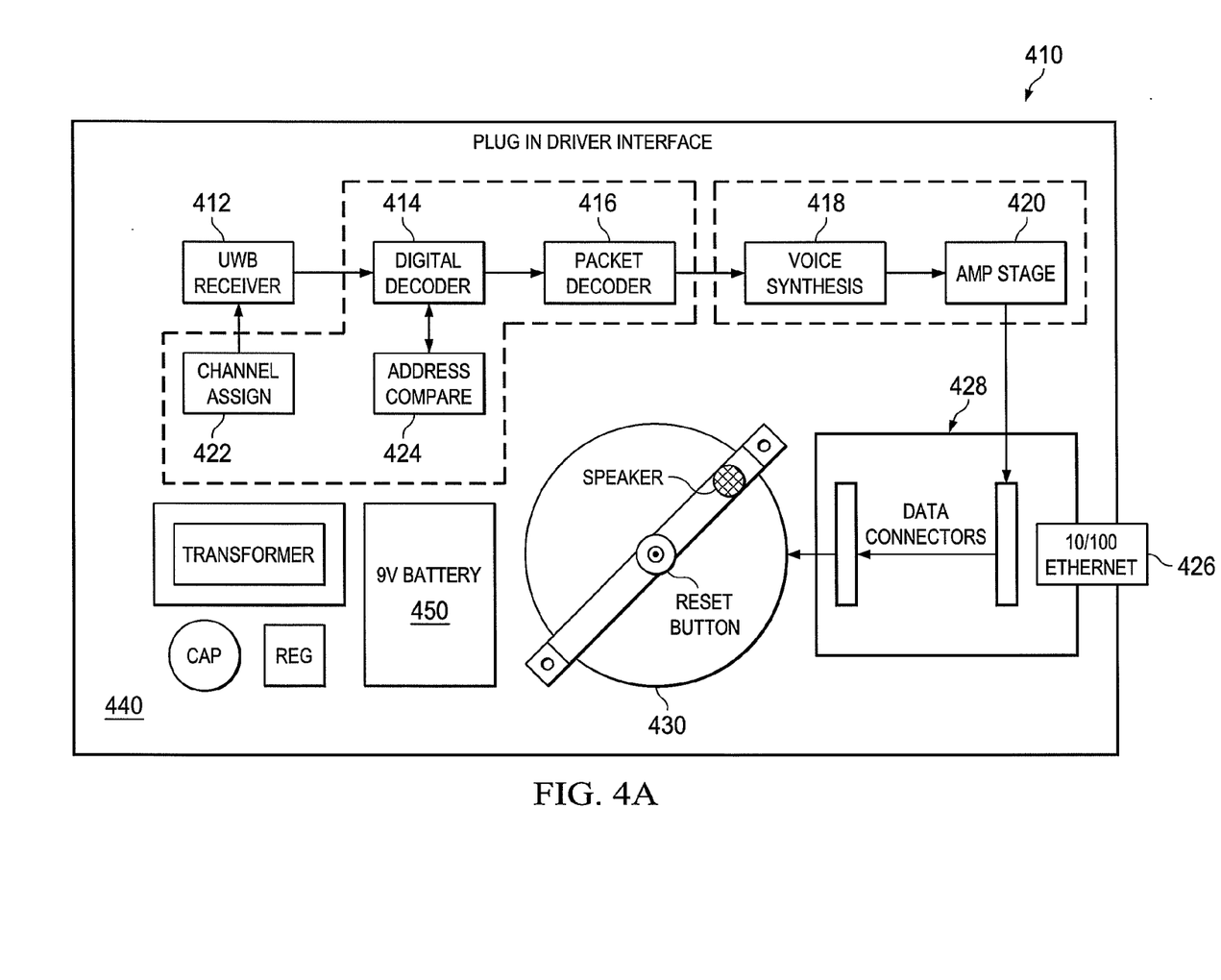
FIGS. 4A and 4B depict functional block diagrams of embodiments of early warning detectors described herein.
Figure 4B:
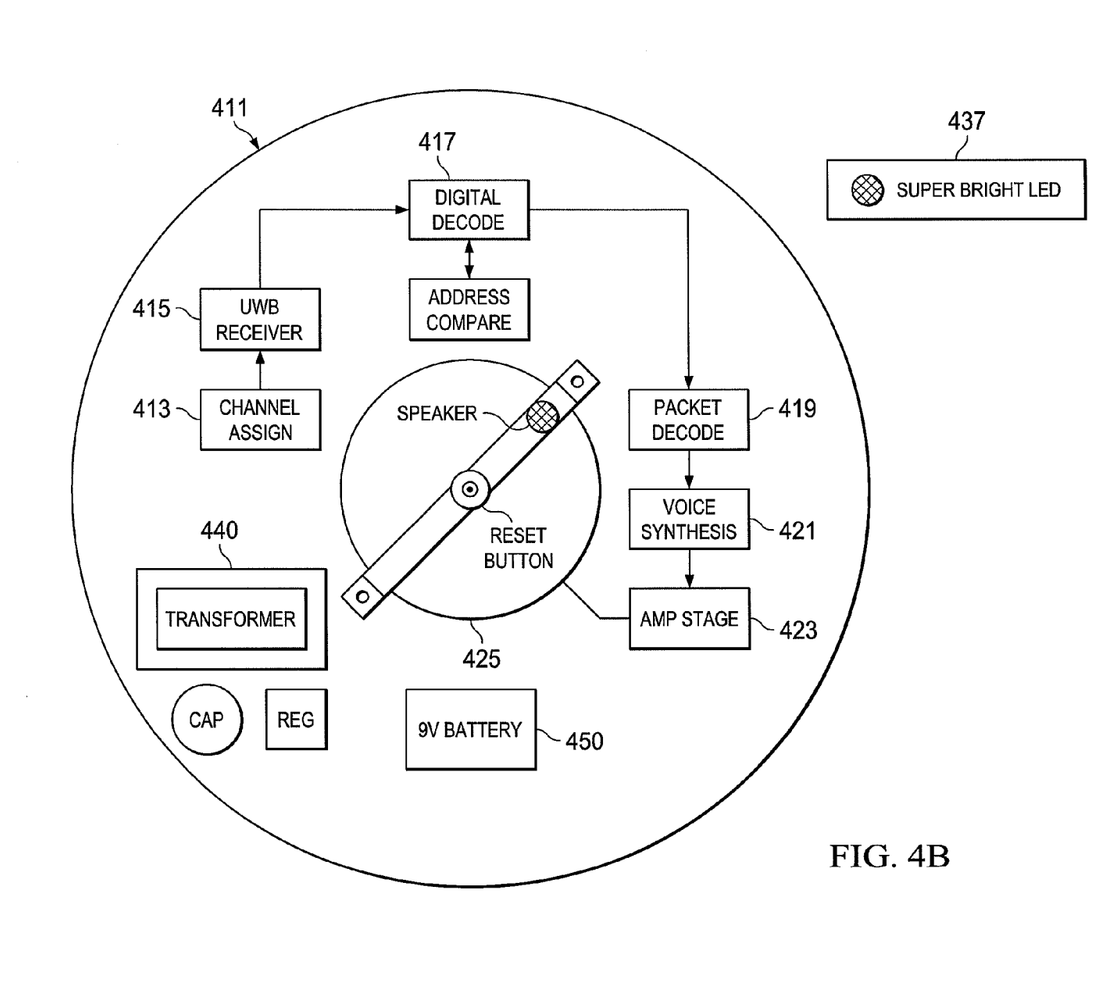

A BCS unit equipped with transceivers is essential for EWS function because they link an Early Warning Detector or EWD with other parts of the network. As such, the BCS combined with the transceiver and a detector, commonly referred to herein as EWD form, in part, the EWS network, capable with minimal cost, of reaching networked and some non-networked homes and offices with signals, including advanced warning signals received by the EWD as shown in FIGS. 4A and 4B.

Figure 8:
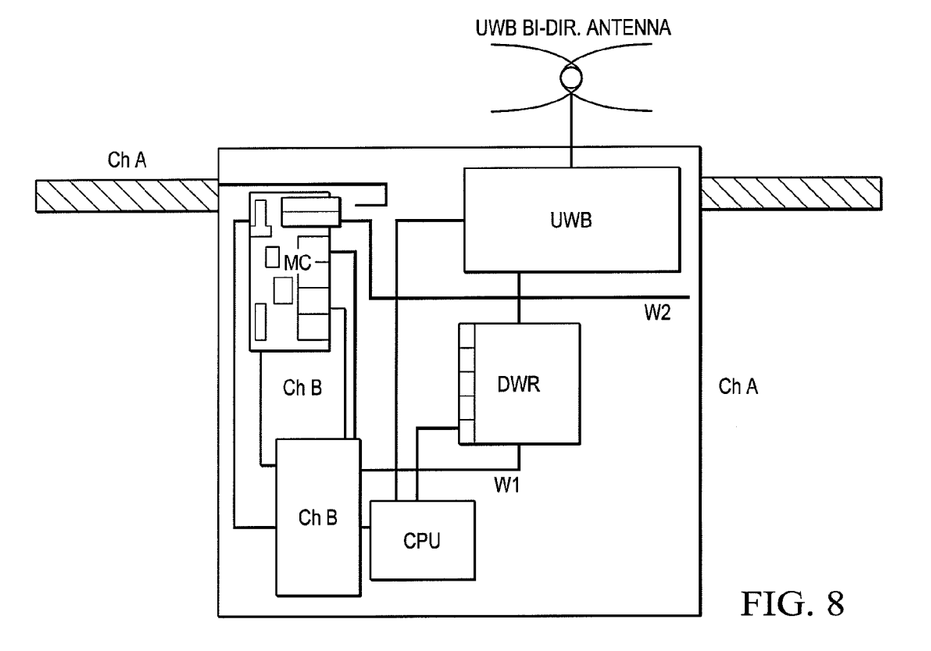
FIG. 8 depicts a SACA junction box with optional bi-directional high gain antenna.

The BCS command consol is powered by one or more UPS and also serves as a power source to the CS. SACA cabling between the CS and the command console is through an improved cable that is both armored and thermally protected with sectionally addressable shielded covering. The cable assembly when combined with a SACA junction box (FIG. 8) component provides terrestrial networking capabilities.

The BCS command console is capable of interconnecting with in-house wiring of its building, either through a direct wired connection or wirelessly by addition of a transceiver and the CS. Hence, communications systems described herein are multiply integrated with some purposeful redundancies.

Non-emergency services are provided by the communications system described herein via one or more central locations (identified as 5, FIG. 1) that are often located in a different city. Such non-emergency services are often referred to as FairWeather services (box 14, FIG. 2) and are comprised of environmental, security, facilities management and remote utilities status and control features using the communications network facilities via a direct and secure connection to any BCS-equipped building.

Figure 6A:
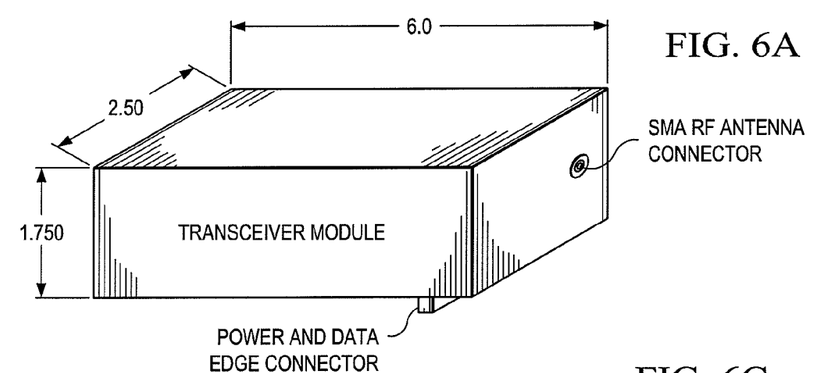
FIG. 6A depicts in a representative transceiver module.

BCS units may also act as relay stations with their attached transceivers to provide broadband connections to emergency vehicles through a mobile communication system (MCS) equipped with a transceiver (FIG. 3; FIG. 6A). This is particularly beneficial when there is no clear information from a satellite. MCS units may also provide access to building information for any building equipped with BCS. Such information may include layout and floor plans, wiring, plumbing and other building-related information which is especially useful to first responders in the time of an emergency.

Figure 6B:
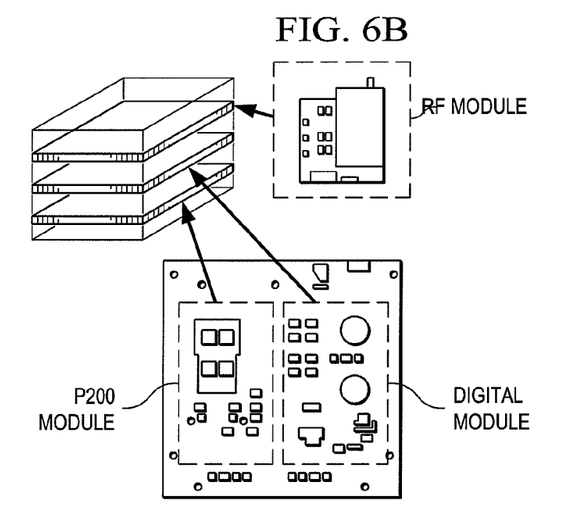
FIG. 6B represents a module in communication with a transceiver or antenna.
Figure 6C:
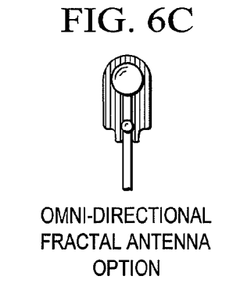
FIGS. 6C represent a fractal antenna.
Figure 6D:
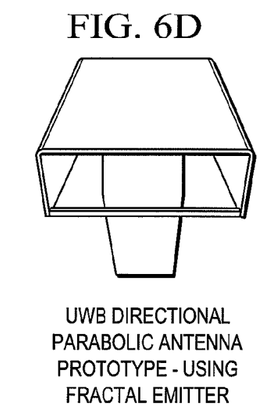
FIG. 6D represents a parabolic antenna.

An optional secondary Ultra Wide Band (UWB)-enabled RF link referred to as a BSC transceiver, may be installed in the BCS command console providing an auto relaying 802.15.3 UWB communication system (FIG. 6A). The BSC transceiver module received 5V power from the SACA junction box motherboard (FIG. 6B). An external SMA-type connector antenna connection on the transceiver accepts various special purpose antenna assemblies designed specifically to augment their application (FIG. 6C, FIG. 6D). The transceiver uses RF circuitry with a powerful processor board and processor. The antenna may optionally be an omni-directional fractal antenna with 50 foot tracking/transmitting distance or an improved parabolic unidirectional antenna for distances up to 500 feet (FIG. 6C). Remote detectors (e.g., sensors sensitive to bio-hazard, radiation, pressure, electro-magnetics, piezoelectricity, heat, etc.) may be linked with the communications system described herein using this same secondary link by installing a 802.15.3/UWB bridge transceiver component nearby which will effortlessly relay signals from detectors back to the command console.

The BCS is designed for longevity and may not be operational for years yet remain functional without further setup or requiring lubrication.

In a first example, should there be an incoming transmission originating from the CDC 310, the signal first strikes the broadband satellite dish 312 as depicted in FIG. 3. From here it flows to the BCS 314 by first transmitting through IRU electronics and becomes a USB signal entering the CS on the roof. The roof top CS contains a UPS rated at 1500 KVA which supplies the regulated 110 volts AC to the CS as well as to an auxiliary DC supply for the EWS 316 and dish mechanics, dish controller and ITU/IRU modules.

Figure 10:
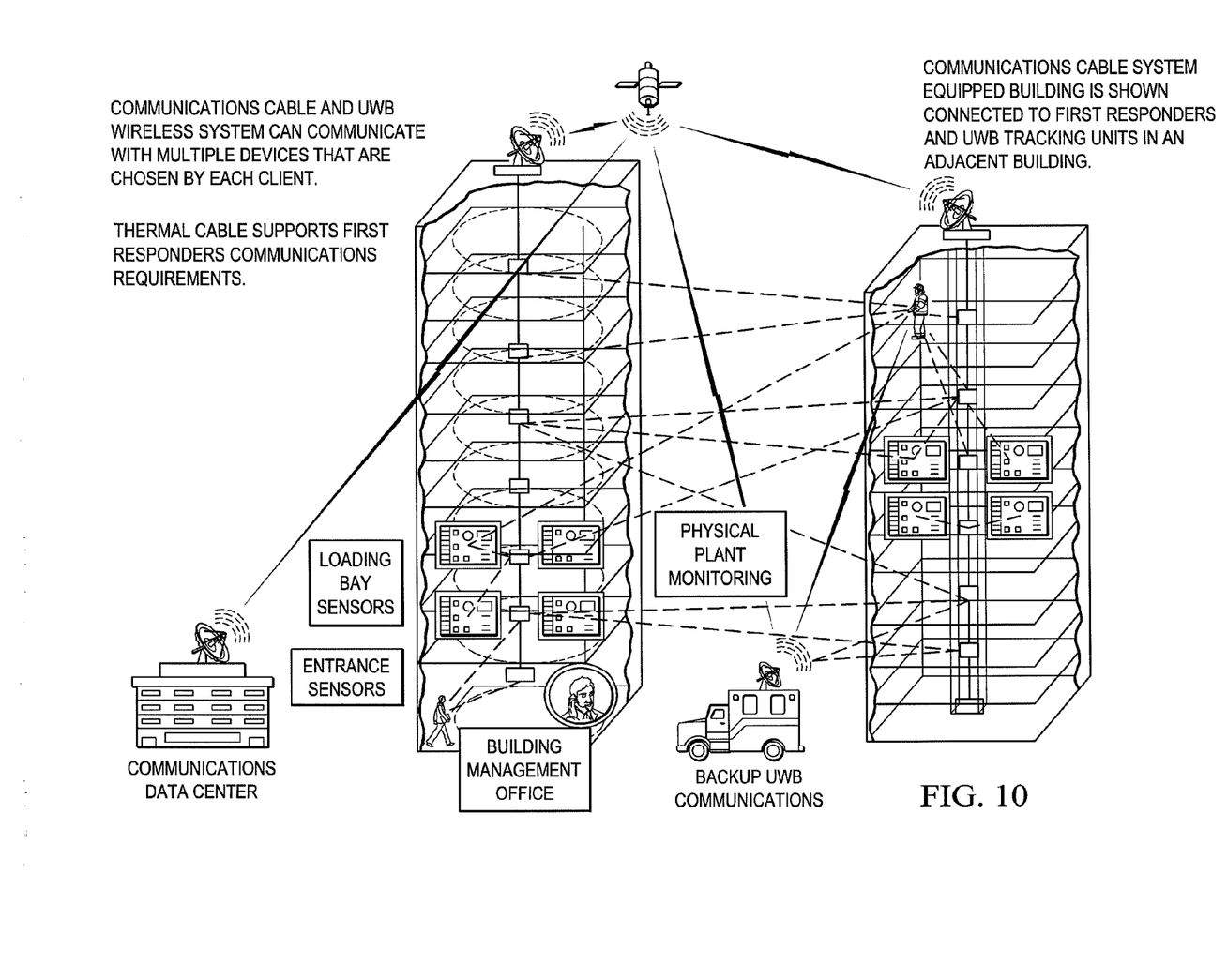
FIG. 10 depicts a representative installation view of a BCS with SACA system in a commercial building as described herein.

The SACA cable assembly system is connected to the CS and to all interior components within the building. A first cable segment usually 10-11 feet down connects via a waterproof SACA-W type cable. From here the cable first terminates in a first SACA junction box. Each segment of the SACA cable assemblies are joined together by a junction box. As such, with each junction box, a breakout point connection is possible, for example at each floor of the building as shown in FIG. 10.

The SACA cable assembly provides fiber optic connectivity that is combined with an optical media repeater and converter for each of fiber channel. Connectivity remains through each junction box, which are each self-powered with their own UPS. As such, there is no cable length limitation that is typically restrained by copper wire communications systems. The communications system is readily adaptable to any horizontal and vertical space, including underground locations. This improvement separates the communications system described herein from other less well designed systems.

Clearly, each building or location will define the arrangement and configuration of the system described herein, which is flexible enough to adapt to any required arrangement. For example, larger structures may require more horizontally oriented components. In addition, more communications channels may be needed, especially vertical components to high-rise buildings. Communications on a floor by floor basis may be distributed either via a secure wireless systems or by individually wired locations routed back to each floor's SACA junction box.

Figure 9:
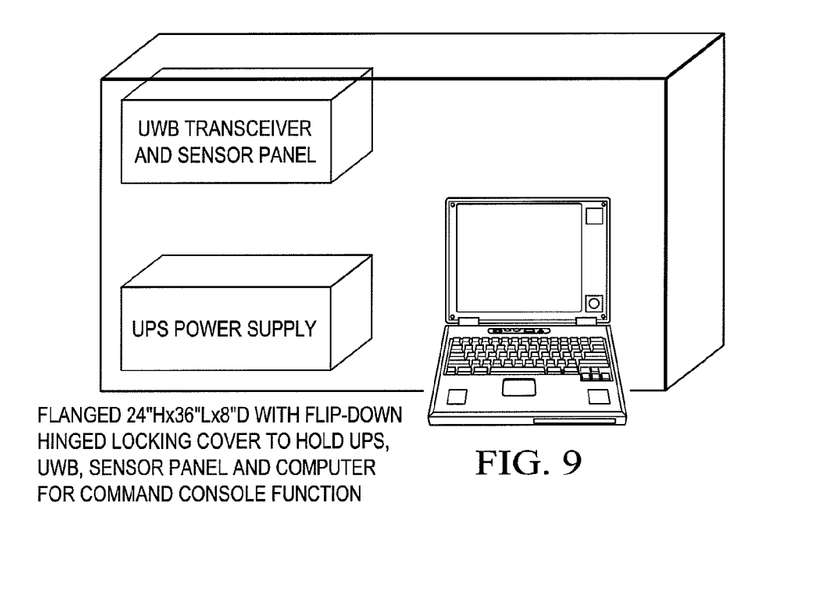
FIG. 9 depicts a representative layout of the command console cabinet.

In a building, a SACA cable assembly terminates at a command console cabinet (FIG. 9) by way of a junction box motherboard. Each command console has its own UPS systems and source AC supply to power itself should the primary rooftop power source become faulty or fail. The junction box motherboard handles all cable terminations and may also be outfitted with a transceiver to enable the cabinet to engage in a wireless connection with remote controller devices or remote sensors, all of which would be outfitted with a transceiver. This remote capability enables the system herein to be configured to any type of broadband enhanced security device making a BCS equipped building one of the most secure structures possible.

With an access point and/or secure bridge into the internet, an authorized user may access the building communications setup described herein while anywhere in the world. Access is made simple by a web browser that allows the authorized used to control, monitor and/or operate any connected device within his building giving him 24/7 access for management and security. The command console optionally has a Voice over Internet Protocol system allowing a user to telephone through the associated bridges and network switches to any regular telephone in any location in the world. The CDC will preferably provide an LDAP type messaging server with both text as well as visual conferencing capabilities.

The command console is a locked device and accessible by authorized personnel only. Inside the command console and accessible through hardware (e.g., computer) are a number of field upgradeable communications programs enabling a user to access immediately the CDC or any location assigned to the building, such as a 911 call center, EOC and the like, including non-emergency assignments. Routing to such assignments is automatic by software that enables it upon pointing and clicking to the desired assignment.

In one or more embodiments, the BCS described herein is an emergency communications system for commercial buildings and complies with a request by the Federal Emergency Management Act of the Building Owners and Managers Association (BOMA). The individually protected power systems as provide by each UPS at each unit ensures that the communications system described herein will operate as an emergency communications system especially during a disaster. Because the system herein does not rely solely on ground/terrestrial infrastructure for connectivity and communication, the system herein is multi-functional and offers a very wide band for connectivity. External sensors, such as a Q-Box with its P- and S-wave detection for seismic activity and/or radiation, bio-chemical and explosive detectors, may be a part of a system described herein, thus, offering enhanced emergency capabilities.

One or more central CDCs coordinate all communications between BCS locations as well as provide a bridge to other systems or international offices. When used along with wireless extensions for police and first responders, broadband communications are available to any nearby device capable of receiving the communication, including an emergency vehicle. The BCS when equipped with a transceiver becomes an early warning system that Federal and State governments have been unable to replace and relay station for any sensor or detector it is in communication with.

The EWS will include software from a CDC. In general, the CDC is both a data collection and data authentication point for various levels and locations of authoritative data collected and processed one or more locations. The CDC is a dedicated emergency communications carrier which ensures that it will offer sufficient bandwidth to act timely and expansively when needed. In one form, the CDC is a central point in a communications systems for issuing public warnings or alerts. The complexity of the routing is depicted generally in FIG. 3.

In the event of an emergency, satellite television from other locations will not receive local alerts. Dedicated receivers, such as weather radios or tornado watch, do not provide audible alerts and require that one is tuned to their specific channel.

As an improvement, the EWS system described uses existing satellite networks, generally comprised of the latest generation band satellites, and therefore the Wide Area Network (WAN) portion of the network is inexpensive to operate when compared with ground based infrastructure. The bandwidth associated with satellite systems combined with cost of small VSAT type earth station dishes enables the system herein to be especially cost effective. Bandwidth via satellite for emergency communications is available because every carrier must provide time and bandwidth for all authorized emergency communications without charge as a condition of their broadcast license.

Figure 5:
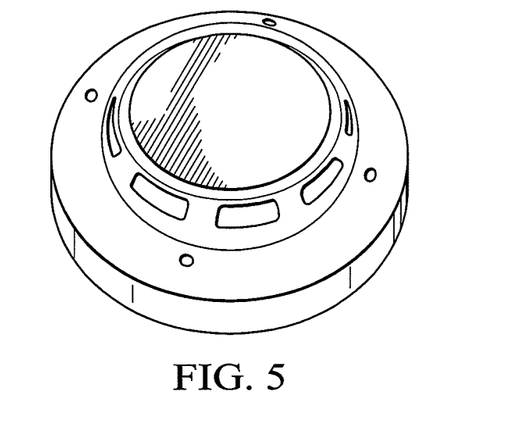
FIG. 5 depicts a prototype for a detector described herein.

The BCS communications system takes advantage of the broadband connectivity offered via satellite and ensures that a continuous signal will be received by a downstream end user regardless of distance The EWD is similar in its features to a miniaturized UWB receiver with a processor and voice synthesis circuit, all built into one small round circuit board that may easily be added to any existing smoke detector during manufacturing. An exemplified and fabricated EWD is illustrated in FIG. 5. Block diagrams of suitable components are provided in FIGS. 4A and 4B.

The UWB radio is identified with an embedded media access control (MAC) address scheme. This MAC address along with its assigned TCP/IP address becomes the identity recorded for each new EWD unit. This alone provides an enormous improvement over a conventional emergency radio. Furthermore due to its TCP/IP structure and its digital signally methodology, the transmission time to a EWD is short and multiple units may be addressed at the same time, if desired. With a chipset that has the ability to vectorize a transmission and accurately calculate the exact position of each transceiver working in union with it, exact calculated positioning of each EWD may be made and each may then operate and communicate with a BCS unit.

The EWS itself uses a relational graphical information system (GIS) database to first plot the macro and micro geographic location of each compatible unit (e.g., BCS, EWD; see box 26, 30, FIG. 2). When the EWS relational GIS database first registers a compatible unit, it asks the CS to report back its GPS coordinates, which are recorded far more accurately than typical GPS location systems. The EWS also requests elevation data from the compatible unit.

For each compatible unit, exact GPS coordinates are 3 dimensional rather than typical 2 dimensional mapping data (which allows the system described herein to take part in 3D vectorization) as provided by others. When vectors are formed from different altitudes as well as longitudes and latitudes and especially 2 or more transceivers communicate or locate a respective EWD, the accuracy may be in inches, making it far more accurate than GPS systems today. Each vector angle and end destination identity of transceiver or EWD unit is precise, down to even its altitude (e.g., what floor of a building it is on).

As such, the EWS may solicit and identify each EWD unit installed and verify by offsetting the compatible unit with its precise GPS location including altitude, which then provides a vectored, precise micro-geographic location of that EWD;

the location is registered in a master GIS database within the EWS system. The ability to pinpoint location in 3 dimensions is very powerful and previously unavailable.

When a specific location is threatened, EWS is designed to provide advice and/or initiate immediate action. Referring again to FIG. 2, the flow chart shows that there are many ways to initiate an alert. EWS is prepared with a hierarchical response to prevent a false alert. Various authorities with information are fed to the CDC where the EWS system begins to calculate both the origin and destination of each threat as well as the time duration and maps areas through which an alert (threat) will move until the threat is gone.

Improved software based on a modeling system has also been prepared that inputs the data described and plots said data on an active GIS grid representing the area affected. This source data is represented by areas of impact with boundaries in place for each type of event at a particular moment.

The EWS system software also incorporates data which is constantly being received from an area of impact, affect data reflecting environmental patterns, such as wind speed, river and traffic data, air traffic routes, as examples, which may be provided by one or a number of sources including local law enforcement and emergency response personnel. The affect data is typically being updated into the active GIS database on a regular basis. Together and in combination with additional factors, the accumulated data helps define a timeline for response to each event.

In an example, an event may be an overturned chlorine tanker that is leaking fumes. Such an event would be immediately alerted to the EWS system and EWD units would provide immediate warnings. Current weather or wind conditions are calculated in combination with the source of the chlorine leak, the specific gravity and dispersal characteristics and then stepped in time and plotted every 10 or 15 minutes into the future till the event or threat is contained or no longer a threat. Periodic forward time advances are also taken showing future effects and/or direction of movement given all the above influencing factors and how this event will move over a threatening period. Such projections will typically continue until the event has moved away or is no longer a threat.

All potential targets and potential victims of an event are quickly accessed and a plume map or track is created, which will typically become the search pattern for an EWS system to use when tracking each of the EWD units in the affected area. The plume map is gathered within milliseconds or seconds, which is followed by transmitting select information (alert) only to the identified transceivers (affected EWD). The EWD may be engaged with an alarm that will sound when activated by the alert. If desired, EWD units closest to the actual events may receive a different alert than those farther away. The unique concept and principle that allows for tiers of EWD units to behave differently is because the alert is sent directly to each EWD (because of its micro-geographic relevance, digital addressing and vectorization placement). The alerts are delivered much faster than cell phone delivery because it is made via an encrypted short data stream burst that reacts much faster than any analog voice message that is typically relied on by other emergency response systems.

This digital warning stream sent out by the EWS is a code sequence of numbers that represent stored phrases activated for remote speech synthesis at each selected EWD unit (FIGS. 4A and 4B). An individually addressable and micro-geographically located EWD unit will receive a number sequence from the EWS system through the UWB telecast coming from each respective transceiver system. This sequence when receive by the EWD circuit takes the sequential number sequence coming in and uses it to call up a phrase number in a RAM storage unit contained in each EWD board.

The number sequence entering the RAM (in the add-on EWD board), enters as an address for an immediate playback sequence of the data stored at that location. When multiple numbers are received in the proper sequence as created by an EWD encryption system, a resulting sampled digitized voice sequence is prepared and fed next into a voice synthesis unit. Each EWD (via the EWS) has a lookup table for phrases previously downloaded to each EWD, and the phrase number becomes a trigger address for each voiced phrase.

A downloadable phrase library may be provided to the EWD RAM; this downloading may be performed by many EWDs at the same time using any of the supported languages. The unique address and registered owner may makes each EWD into a personal mail box for voice files that match that end user's needs. A sequence, such as <23,2,44,76,3,1,25> may translate as Warning, Tornado, Approaching, Seek Shelter, Expected, 15 minutes, US Meteorology Service. The message will continue until a Silence Button on top of the unit is depressed. When an alert is received a wide angle bright indicator lamp on each EWD will flash RED, indicating a maximum alert, mandatory action status. Although the voice message following the button depression will silence the warning, the lamp will continue to flash until the message is no longer received. Should someone enter a location with a flashing EWD lamp, by pressing the Silence Button again, the EWD will voice and repeat the last stored alert. The flashing lamp on the EWD may be extended remotely to one or more visible locations as desired, which is an enhanced feature for the hearing impaired. This is available through a fully buffered interface section that allows the EWD to interconnect with an in-house communications or security systems. This buffered interconnection feature allows the Indicator Lamp, the audio output or TTL level input output signals to be interfaced to the unit for remote communications capability. The buffered interface strip insures any outside connection that might damage the EWD unit does not interfere with its constant on operating condition.

The EWD is equipped with a battery backup to ensures continuous function regardless of local power conditions. Ancillary equipment connected to the EWD unit will not be powered by the EWD unit and should be powered separately by a UPS protected system so that it will remain fault tolerant.

Referring back to the EWS, it not only delivers warnings to EWD units, it also is an input sensor system. A Q-Box, which is a P- and S-wave detector system for accurate forward detection of seismic activity (e.g., earthquakes), is embedded in junction box or CS and/or BCS transceivers. The EWS receives output alerts from a Q-Box that detects activity (relayed in via one or more junction boxes or transceivers). These message are collectively assembled along with the original micro-geographic location data to provide an extensive earthquake warning system ever which may, in turn, be relayed to the National Earthquake Center for further analysis. Any recommendations from the National Earthquake Center will generally be sent back to the CDC and EWS and with a plume map in place, the respective EWDs will be contacted. This transmission just described takes only minutes which affords plenty of time for attending to preparedness of any imminent impact.

In one form, the EWS is a unique deliverable solution to an aging and failing Emergency Broadcast System and Emergency Alert System, which for a large part rely on aged and unreliable or inactive Air Raid Siren installations. The EWS is central to computing and analyzing warnings in order to take immediate action.

While specific alternatives to steps of the invention have been described herein, additional alternatives not specifically disclosed but known in the art are intended to fall within the scope of the invention. Thus, it is understood that other applications of the present invention will be apparent to those skilled in the art upon reading the described embodiment and after consideration of the appended claims and drawing.

What is claimed:

1. A networked communications system comprising:
   one or more integrated satellite based devices for broadband digital signaling;
   a command console comprising interconnectivity with public data or voice network signals through digital bridging;
   one or more customized segment addressable cable assemblies for terrestrial signaling, wherein the one or more customized segment addressable cable assemblies are in operable communication with and terminate at the one or more integrated satellite based devices and the command console, and wherein the one or more customized segment addressable cable assemblies are customized for a particular location and further comprise one or more sectionally accessible junction boxes between individual segments of mechanically armored and thermally protected cable; and
   a remote relay station in operable communication with the command console via the public data or voice network signals and the one or more integrated satellite based devices via the broadband digital signaling,
   wherein the one or more integrated satellite based devices comprises a self-stabilizing mount configured to adjust the one or more integrated satellite based devices to be in constant alignment with a desired satellite when the alignment of the one or more integrated satellite based devices is altered due to external environmental changes,
   wherein the command console is configured to initiate communications with a stationary safe location point via the one or more integrated satellite based devices while also maintaining the interconnectivity with the public data or voice network signals,
   wherein the one or more integrated satellite based devices each comprises a transceiver linked to one or more detectors, which together form an emergency warning detector (EWD),
   wherein the networked communications system is configured to pinpoint a location of the EWD by offsetting the one or more integrated satellite devices with a precise global positioning satellite (GPS) location including altitude,
   wherein the networked communications system is configured to provide a vectored, precise micro-geographic location of the EWD based on the offsetting of the one or more integrated satellite devices, and
   wherein the networked communications system is configured to be prepared with a hierarchical response to prevent a false alert.

2. The system of claim 1, wherein each of the one or more integrated satellite based devices has a transceiver and is coupled with ultra wide band (UWB) technology to re-broadcast information to other receivers.

3. The system of claim 1, wherein the command console comprises hardware, its own un-interruptible power supply (UPS) power supply, a routing box, and a transceiver.

4. The system of claim 1, wherein the command console serves as a primary power source to one or more of the one or more integrated satellite based devices.

5. The system of claim 1, wherein the command console is interconnects with a pre-wired system in a building.

6. The system of claim 1, wherein the command console comprises a UWB bridge component.

7. The system of claim 1, wherein a building equipped with the one or more integrated satellite based devices and the command console also act as a relay station by way of transceivers.

8. The system of claim 1, wherein the one or more integrated satellite based devices each comprise a satellite dish mounted using a stainless steel gimbaled mount system, a transceiver and is in operable communication with a controller.

9. The system of claim 1, wherein the one or more integrated satellite based devices each comprise a transceiver having a UWB radio frequency device operating at 802.15.3 and 802.15.4 and provide broadband re-direct-able connections to other sites equipped to receive the re-directable connections.

10. The system of claim 1, wherein the command console is operable By the remote relay station via the satellite device.

11. A method, comprising:
    sending a broadband digital signal from at least one integrated satellite based device;
    communicating with a command console, wherein the command console comprises interconnectivity with public data or voice network signals through digital bridging; and
    adjusting an alignment of the at least one integrated satellite based device using a self-stabilizing mount to be in constant alignment with a desired satellite when the alignment of the at least one integrated satellite based device is altered due to external environmental changes,
    wherein at least one customized segment addressable cable assemblies for terrestrial signaling is in operable communication with and terminate of the at least one integrated satellite based device and the command console,
    wherein the at least one customized segment addressable cable assemblies are customized for a particular location, and comprise one or more sectionally accessible junction boxes between individual segments of mechanically armored and thermally protected cable,
    wherein the command console is configured to initiate communications with a stationary safe location point via the at least one integrated satellite based devices while also maintaining the interconnectivity with the public data or voice network signals,
    wherein the at least one integrated satellite based device comprises a transceiver linked to one or more detectors, which together form an emergency warning detector (EWD),
    wherein the method further comprises pinpointing a location of the EWD by offsetting the at least one integrated satellite devices with a precise global positioning satellite (GPS) location including altitude, wherein the method further comprises providing a vectored, precise micro-geographic location of the EWD based on the offsetting of the at least one integrated satellite devices, and wherein the method further comprises being prepared with a hierarchical response to prevent a false alert.

12. A method, comprising:

establishing, by a command console, an interconnectivity with public data or voice network signals through digital bridging; and initiating communications with a stationary safe location point via one or more integrated satellite based devices while also maintaining the interconnectivity with the public data or voice network signals, wherein the communications with the stationary safe location point is established via a broadband connection through the one or more integrated satellite based devices, wherein the command console is connected to the one or more integrated satellite based devices via a customized segment addressable cable assembly, wherein communications from the command console to the stationary safe location point via the one or more integrated satellite based devices is maintained with a self-stabilizing mount of the one or more integrated satellite based devices that is configured to adjust the one or more integrated satellite based devices to be in constant alignment with a desired satellite when the alignment of the one or more integrated satellite based devices is altered due to external environmental changes, wherein the one or more integrated satellite based device comprises a transceiver linked to one or more detectors, which together form an emergency warning detector (EWD), wherein the method further comprises pinpointing a location of the EWD by offsetting the one or more integrated satellite devices with a precise global positioning satellite (GPS) location including altitude, wherein the method further comprises providing a vectored, precise micro-geographic location of the EWD based on the offsetting of the one or more integrated satellite devices, and wherein the method further comprises being prepared with a hierarchical response to prevent a false alert.

* * * * *